United States Patent
Yoo

(10) Patent No.: US 10,475,653 B2
(45) Date of Patent: Nov. 12, 2019

(54) METHODS OF FABRICATING FERROELECTRIC MEMORY DEVICES

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/016,602

(22) Filed: Jun. 24, 2018

(65) Prior Publication Data

US 2019/0019683 A1 Jan. 17, 2019

(30) Foreign Application Priority Data

Jul. 14, 2017 (KR) .................. 10-2017-0089924

(51) Int. Cl.
| | |
|---|---|
| *H01L 29/78* | (2006.01) |
| *H01L 21/28* | (2006.01) |
| *H01L 21/02* | (2006.01) |
| *H01L 29/51* | (2006.01) |
| *H01L 29/66* | (2006.01) |
| *H01L 27/1159* | (2017.01) |
| *G11C 11/22* | (2006.01) |
| *H01L 21/3115* | (2006.01) |

(52) U.S. Cl.
CPC .... *H01L 21/28291* (2013.01); *G11C 11/2273* (2013.01); *G11C 11/2275* (2013.01); *H01L 21/0234* (2013.01); *H01L 21/02181* (2013.01); *H01L 21/02189* (2013.01); *H01L 21/02304* (2013.01); *H01L 21/02356* (2013.01); *H01L 21/31155* (2013.01); *H01L 27/1159* (2013.01); *H01L 29/516* (2013.01); *H01L 29/517* (2013.01); *H01L 29/6684* (2013.01); *H01L 29/78391* (2014.09); *G11C 11/223* (2013.01)

(58) Field of Classification Search
CPC ............ H01L 21/28291; H01L 29/516; H01L 29/6684; H01L 29/78391
See application file for complete search history.

(56) References Cited

U.S. PATENT DOCUMENTS

| | | | |
|---|---|---|---|
| 6,335,207 B1 * | 1/2002 | Joo ..................... | C23C 14/0036 438/3 |
| 7,709,359 B2 | 5/2010 | Boescke et al. | |
| 8,304,823 B2 * | 11/2012 | Boescke ................. | G11C 11/22 257/295 |
| 2005/0236652 A1 * | 10/2005 | Kijima .............. | H01L 21/28167 257/213 |
| 2015/0333258 A1 | 11/2015 | Fujii et al. | |

(Continued)

OTHER PUBLICATIONS

"Ferroelectric phase stabilization of HfO2 by nitrogen doping" Applied Physics Express 9, 091501 (2016) by Lun Xu et al. (Year: 2016).*

(Continued)

*Primary Examiner* — Eric A. Ward

(57) ABSTRACT

A method of fabricating a ferroelectric memory device is provided. The method includes preparing a substrate, forming an interfacial insulation layer on the substrate, forming a ferroelectric layer on the interfacial insulation layer, applying a surface treatment process to the ferroelectric layer to form an oxygen vacancy region in the ferroelectric layer, forming a gate electrode layer on the ferroelectric layer, and annealing the ferroelectric layer to crystallize the ferroelectric layer.

20 Claims, 15 Drawing Sheets

(56) References Cited

U.S. PATENT DOCUMENTS

2016/0005961 A1\* 1/2016 Ino .................... H01L 45/04
              257/4
2017/0309488 A1\* 10/2017 Sakai ................ H01L 21/022
2018/0166453 A1\* 6/2018 Muller ............... H01L 49/02
2018/0337055 A1\* 11/2018 Yamaguchi ....... H01L 21/02197

OTHER PUBLICATIONS

"First principles calculations of oxygen vacancy passivation by fluorine in hafnium oxide" Appl. Phys. Lett. 89, 152904 (2006) to Wei Chen et al. (Year: 2006).\*

"Evidence for oxygen vacancies movement during wake-up in ferroelectric hafnium oxide" Appl. Phys. Lett. 108, 032903 (2016) by S. Starschich et al. (Year: 2016).\*

\* cited by examiner

METHODS OF FABRICATING FERROELECTRIC MEMORY DEVICES

CROSS-REFERENCE TO RELATED APPLICATIONS

The present application claims priority under 35 U.S.C 119(a) to Korean Application No. 10-2017-0089924, filed on Jul. 14, 2017, which is herein incorporated by reference in its entirety.

BACKGROUND

1. Technical Field

The present disclosure relates to methods of fabricating ferroelectric memory devices.

2. Related Art

In general, a ferroelectric material may have spontaneous polarization in the absence of an externally applied external electric field. In addition, the ferroelectric material may have any one of two stable remanent polarizations, which are opposite to each other on a hysteresis loop, even after the external electric field is applied and then removed. Accordingly, the ferroelectric material may be attractive as a candidate for a material employed in nonvolatile memory cells that store data corresponding to a logic "0" and a logic "1".

Recently, a lot of effort has been focused on developing ferroelectric memory devices including field effect transistor (FET) type memory cells in which the ferroelectric material used in as a gate dielectric layer. A write operation of a ferroelectric memory device may be performed by applying a known or preset write voltage to a gate electrode of an FET-type memory cell to create a remanent polarization in the gate dielectric layer of the memory cell. In such a case, a channel resistance value of the FET-type memory cell may vary according to an intensity and a direction of the remanent polarization retained in the gate dielectric layer of the FET-type memory cell. Subsequently, a read operation of the ferroelectric memory device may be performed by sensing a cell current flowing through a channel region of the FET-type memory cell.

SUMMARY

According to an embodiment, there is provided a method of fabricating a ferroelectric memory device. The method may include preparing a substrate, forming an interfacial insulation layer on the substrate, forming a ferroelectric layer on the interfacial insulation layer, applying a surface treatment process to the ferroelectric layer to form an oxygen vacancy region in the ferroelectric layer, forming a gate electrode layer on the ferroelectric layer, and annealing the ferroelectric layer to crystallize the ferroelectric layer.

According to another embodiment, there is provided a method of fabricating a ferroelectric memory device. The method may include preparing a substrate, forming an interfacial insulation layer on the substrate, forming a ferroelectric layer including a metal oxide material on the interfacial insulation layer, applying a surface treatment process to the ferroelectric layer to increase a concentration of oxygen vacancies in the metal oxide material, forming a gate electrode layer on the ferroelectric layer, and annealing the ferroelectric layer, using the gate electrode layer as a capping layer, to crystallize the ferroelectric layer.

DETAILED DESCRIPTION OF THE EMBODIMENTS

Figure 1:
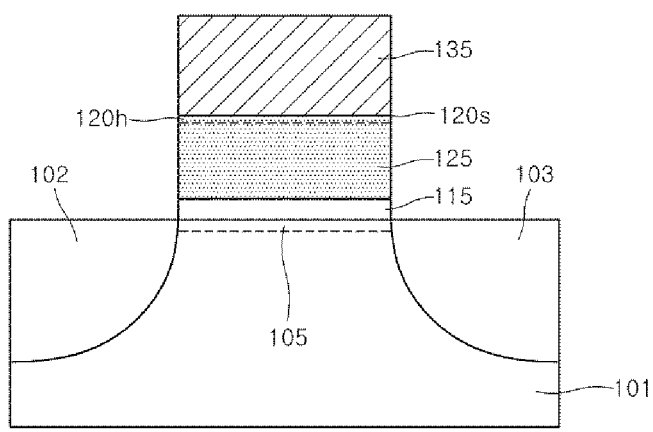
FIG. 1 is a cross-sectional view schematically illustrating a ferroelectric memory device according to an embodiment of the present disclosure.

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Furthermore, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Moreover, two or more process steps sequentially performed in an embodiment may be simultaneously performed in another embodiment.

FIG. 1 is a cross-sectional view schematically illustrating a ferroelectric memory device 1 included in a ferroelectric memory device according to an embodiment of the present disclosure.

Referring to FIG. 1, the ferroelectric memory device 1 may include an interfacial insulation pattern 115, a ferroelectric pattern 125 and a gate electrode pattern 135 which are sequentially stacked on a substrate 101. The ferroelectric memory device 1 may be an FET-type memory cell whose channel resistance value varies according to a direction and magnitude of a polarization in the ferroelectric pattern 125. In addition, a source region 102 and a drain region 103 may be disposed in the substrate 101 to be spaced apart from each other. The interfacial insulation pattern 115 may be disposed on the substrate 101 substantially between the source region 102 and the drain region 103.

The ferroelectric memory device 1 may execute operations which are described hereinafter. If a write voltage is applied to the gate electrode pattern 135, then the polarization direction or orientation of the ferroelectric pattern 125 can be altered in response to the electric field that results from the write voltage. After the write voltage is removed, a remanent polarization, having the same direction as the polarization produced in the ferroelectric pattern 125 in response to the write voltage, may be retained in the ferroelectric pattern 125. The remanent polarization may correspond to a stored datum in the ferroelectric memory device 1. Furthermore, the remanent polarization in the ferroelectric pattern 125 may induce electrons into a channel region 105, repel electrons from the channel region 105 into other regions of the substrate 101, or may induce holes into the channel region 105. As reflected in FIG. 1, the channel region 105 may be a portion of the substrate 101, adjacent to the interfacial insulation pattern 115, and located between the source region 102 and the drain region 103. Conceptually, a channel layer electrically connecting the source region 102 to the drain region 103 may be located in the channel region 105. An electrical resistance value of the channel layer may be referred as a channel resistance value, which can vary.

If a read voltage is applied to the gate electrode pattern 135, then a channel resistance value between the source region 102 and the drain region 103 may vary according to the substrate conductivity type and the quantity and nature of the charges induced into or repelled from the channel region 105. A datum stored in the ferroelectric memory device 1 may be read out by sensing a channel current flowing through the channel layer between the source region 102 and the drain region 103. If the ferroelectric memory device 1 is an N-channel FET-type memory device, then a channel resistance value of the ferroelectric memory device 1 may be reduced or lowered as a concentration of electrons induced into the channel region 105 increases.

The substrate 101 may include a semiconductor substrate. For example, the substrate 101 may be a silicon (Si) substrate, a gallium arsenide (GaAs) substrate, an indium phosphide (InP) substrate, a germanium (Ge) substrate or a silicon germanium (SiGe) substrate. In an embodiment, the substrate 101 may be doped with impurities to have a conductivity type. For example, the substrate 101 may be doped with P-type impurities to provide a P-type substrate. In another embodiment, the substrate 101 may include a P-type well (not shown) formed in the substrate 101. In this case, the channel region 105 may be located inside the P-type well.

As illustrated in FIG. 1, the source region 102 and the drain region 103 may be disposed at both sides or ends of the channel region 105, respectively. In an embodiment, if the substrate 101 is doped with P-type impurities, then the source region 102 and the drain region 103 may be doped with N-type impurities.

The interfacial insulation pattern 115 may be disposed on the substrate 101. The interfacial insulation pattern 115 may be disposed between the substrate 101 and the ferroelectric pattern 125 to suppress or block inter-diffusion of atoms between the substrate 101 and the ferroelectric pattern 125. In addition, the interfacial insulation pattern 115 may prevent the direct contact between the substrate 101 and the ferroelectric pattern 125, particularly when the substrate 101 and the ferroelectric pattern 125 have different lattice constants. Crystal defects generated by lattice strain at the interface could limit or deter defect formation between the between the substrate 101 and the ferroelectric pattern 125.

The interfacial insulation pattern 115 may include, for example, a silicon oxide (SiO) material, a silicon nitride (SiN) material, a silicon oxynitride (SiON) material, an aluminum oxide (AlO) material or a combination material containing at least two different materials thereof. In an embodiment, if the substrate 101 is a silicon substrate, then the interfacial insulation pattern 115 may be a silicon oxide (SiO) layer, a silicon nitride (SiN) layer, a silicon oxynitride (SiON) layer or a combination material containing at least two different materials thereof.

The ferroelectric pattern 125 may be disposed on the interfacial insulation pattern 115 opposite to or on the other side of the substrate 101. The ferroelectric pattern 125 may include a ferroelectric material which is capable of retaining a remanent polarization. In an embodiment, the remanent polarization in the ferroelectric pattern 125 may induce electrons to move into the channel region 105 of the substrate 101, or may repel the electrons from the channel region 105.

A channel resistance value between the source region 102 and the drain region 103 may vary depending on a concentration of the charges induced into or repelled out of the channel region 105. In an embodiment, the ferroelectric pattern 125 may have a thickness of approximately seven (7) nanometers (nm) to approximately fifteen (15) nm. The ferroelectric pattern 125 may include an oxygen vacancy region 120$h$. The oxygen vacancy region 120$h$ may extend from a top surface 120$s$ of the ferroelectric pattern 125 into the ferroelectric pattern 125 and have a thickness of approximately one (1) nm to approximately two (2) nm.

In an embodiment, the ferroelectric pattern 125 may include a metal oxide material having a crystalline structure. The ferroelectric pattern 125 may include a binary metal oxide material. For example, the ferroelectric pattern 125 may include a hafnium oxide (HfO) material, a zirconium oxide (ZrO) material or a combination thereof. The ferroelectric pattern 125 may have an orthorhombic crystalline structure.

In an embodiment, the ferroelectric pattern 125 may include at least one dopant. The dopant in the ferroelectric pattern 125 may be uniformly distributed. The dopant distributed in the ferroelectric pattern 125 may stabilize a ferroelectric property of the ferroelectric pattern 125. If the ferroelectric pattern 125 includes a hafnium oxide (HfO) material, a zirconium oxide (ZrO) material or a combination thereof, then the ferroelectric pattern 125 may be doped with a dopant having a valence of two to four. For example, the dopant of the ferroelectric pattern 125 may include at least one of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd) and lanthanum (La).

Meanwhile, a polarization formed in the ferroelectric pattern 125 generated by an electric field resulting from an applied voltage may be arrayed to be parallel or aligned with a polarization axis in grains (e.g., crystal grains) of the ferroelectric pattern 125, as described below and with reference to FIGS. 2A, 2B, 2C, 3A, 3B and 3C. The orientation of a polarization axis in a grain in the ferroelectric pattern 125 may be established during a crystallization process. In an embodiment, the grains of the ferroelectric pattern 125 may have polarization axes, and at least two of the polarization axes may have different directions. Alternatively, the grains of the ferroelectric pattern 125 may have polarization axes, and all of the polarization axes may have the same direction.

The gate electrode pattern 135 may be disposed on the ferroelectric pattern 125 opposite to or on the other side of the interfacial insulation pattern 115. The gate electrode pattern 135 may include a conductive material. For example, the gate electrode pattern 135 may include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials thereof.

Figure 2A:
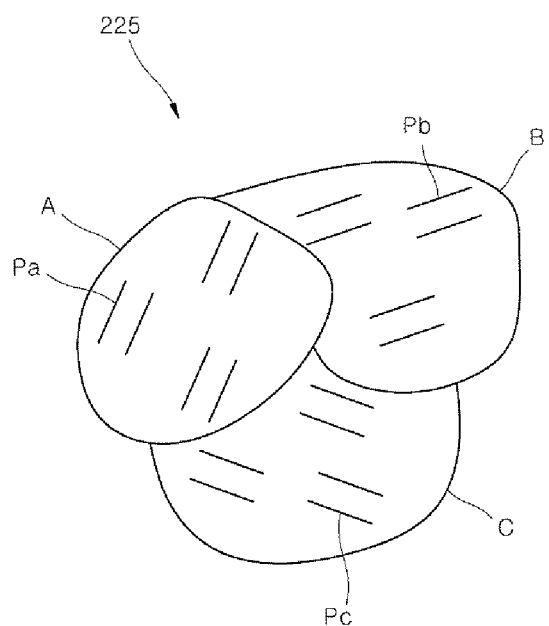
FIGS. 2A, 2B and 2C schematically illustrate a polarization characteristic of a ferroelectric pattern included in a ferroelectric memory device according to a comparative embodiment of the present disclosure.
Figure 2B:
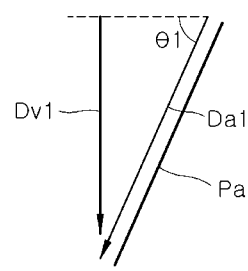
Figure 2B:
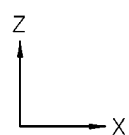
Figure 2C:
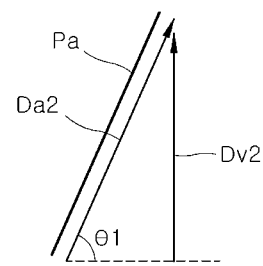
Figure 2C:
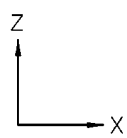
Figure 3A:
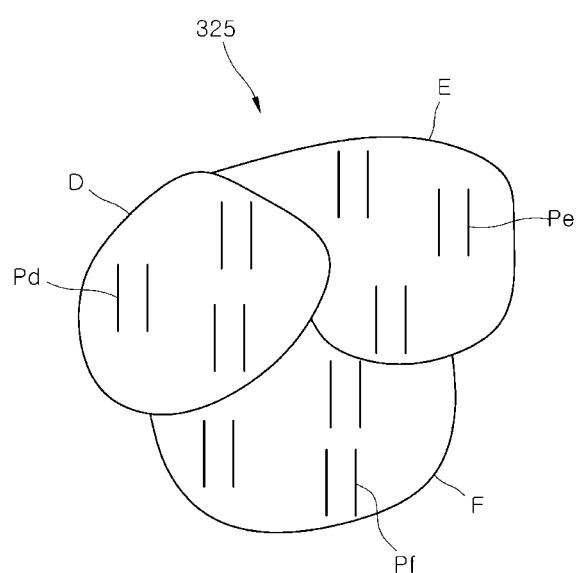
FIGS. 3A, 3B and 3C schematically illustrate a polarization characteristic of a ferroelectric pattern included in a ferroelectric memory device according to an embodiment of the present disclosure.
Figure 3B:
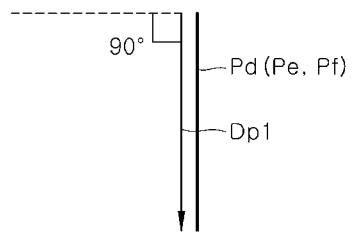
Figure 3B:
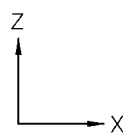
Figure 3C:
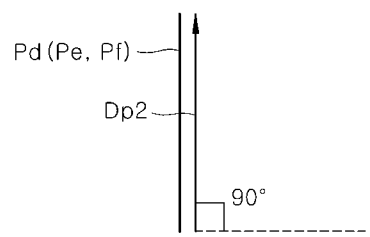
Figure 3C:
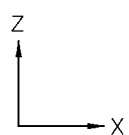

FIGS. 2A, 2B and 2C schematically illustrate a polarization characteristic of a ferroelectric pattern 225 included in a ferroelectric memory device fabricated according to a comparative embodiment of the present disclosure. FIGS. 3A, 3B and 3C schematically illustrate a polarization characteristic of a ferroelectric pattern 325 included in a ferroelectric memory device fabricated according to an embodiment of the present disclosure. The ferroelectric pattern 225 or 325 illustrated in FIGS. 3A, 3B, 3C, 2A, 2B and 2C may be found in the ferroelectric patterns 125 in the ferroelectric memory device 1 described above and with reference to FIG. 1. In FIGS. 2A, 2B, 2C, 3A, 3B, 3C, x-direction is parallel with a length direction of the ferroelectric patterns 125 (i.e. x-direction shown in FIG. 1) and z-direction is parallel with a thickness direction of the ferroelectric patterns 125 (i.e. z-direction show in FIG. 1). For example, z-direction is parallel with a normal line perpendicular to a surface of the substrate 101, and x-direction is perpendicular to z-direction on the surface of the substrate 101

Referring to FIG. 2A, the ferroelectric pattern 225 may include a plurality of grains, for example, first to third grains A, B and C. Although FIG. 2A illustrates an example in which the ferroelectric pattern 225 includes three grains A, B and C, the present disclosure is not limited thereto. For example, in some embodiments, the ferroelectric pattern 225 may include four or more grains.

The first to third grains A, B and C may each have first to third polarization axes, with polarization axis planar directions Pa, Pb and Pc respectively. In the comparative embodiment, at least one of the polarization axis planar directions Pa, Pb or Pc has a direction which is different from other polarization axis planar directions. For example, the first grain A may have a first polarization axis planar direction Pa, the second grain B may have a second polarization axis planar direction Pb, and the third grain C may have a third polarization axis planar direction Pc. In FIG. 2A, the first, second and third polarization axis planar directions are different from each other.

Meanwhile, if a first write voltage having a positive polarity is applied to the gate electrode pattern 135 of the ferroelectric memory device 1, then the polarization in the ferroelectric pattern 225 may be adjusted to align to an electric field which is created by the first write voltage. The polarization in the ferroelectric pattern 225 may induce electrons into the channel region 105. Also in the presence of an applied write voltage, a unit polarization orientation may be formed in each grain aligned with the grain axis. A planar direction of each unit polarization orientation in grains A, B and C are therefore parallel to the first polarization axis planar direction Pa in the first grain A, the second polarization axis planar direction Pb in the second grain B, and the third polarization axis planar direction Pc in the third grain C. For example, as illustrated in FIG. 2B, a unit polarization vector Da1 in the first grain A may be parallel with the first polarization axis planar direction Pa. A component of unit polarization vector Da1 in a Z-axis direction, that is, a vertical component Dv1, is parallel with a normal line perpendicular to a surface of the substrate 101. Among the components of the unit polarization vector Da1, vertical vector component Dv1 may induce the electrons into the channel region 105 of the substrate 101. In the drawings, an X-axis direction denotes a direction which is parallel to the direction of charge flow in channel region 105 between source region 102 and drain region 103 in the ferroelectric memory device 1.

Similarly, the unit polarization orientation in the second grain B may be aligned with the polarization axis of grain B, and a planar direction of a unit polarization orientation in grain B is parallel to the second polarization axis planar direction Pb. A vertical vector component, parallel with a normal line perpendicular to a surface of the substrate 101, may also effectively induce the electrons into the channel region 105 of the substrate 101. Furthermore, the unit polarization orientation in the third grain C may be parallel with the polarization axis of grain C, and a planar direction of a unit polarization orientation in grain C is parallel to the third polarization axis planar direction Pc. A vertical vector component, parallel with a normal line perpendicular to a surface of the substrate 101, can induce electrons into the channel region 105 of the substrate 101. Consequently, a total polarization of the ferroelectric pattern 225 in the plane may be expressed as a sum of the vertical vector components (i.e., in the z-direction) of the unit polarization vector of the grains A, B and C.

Referring again to FIG. 2B, an intensity or magnitude of the vertical vector component Dv1, which is capable of inducing the electrons into channel region 105, may be determined based on an angle $\theta_1$ between the surface of the substrate 101 and the unit polarization vector Da1 of the first grain A. For example, if the angle $\theta_1$ between the surface of the substrate 101 and the unit polarization vector Da1 of the first grain A is a right angle, then the vertical vector component Dv1, which is capable of inducing the electrons, may have the same value as the unit polarization vector Da1. The same characteristics apply in the second grain B and the third grain C when the angle between the surface of the substrate 101 and the unit polarization vector of each grain is a right angle.

If a second write voltage having a negative polarity is applied to the gate electrode pattern 135 of the ferroelectric memory device 1, then the polarization in the ferroelectric pattern 225 may be oriented according to an electric field which is created by the second write voltage, as illustrated in FIG. 2C. In such a case, the electrons in the channel region 105 may be repelled from the channel region 105 by the polarization in the ferroelectric pattern 225.

Referring again to FIG. 2C, if the second write voltage with an opposite bias is applied to the gate electrode pattern 135 of the ferroelectric memory device 1, then a unit polarization vector Da2 in the first grain A may be arrayed to be parallel with or aligned to the first polarization axis planar direction Pa. A polarization component parallel with the Z-axis direction among components of the unit polarization vector Da2 (i.e., a vertical vector component Dv2) is parallel with a normal line perpendicular to a surface of the substrate 101. Among the components of the unit polarization vector Da2, vertical vector component Dv2 may effectively repel electrons out of the channel region 105 of the substrate 101 and into other regions of the substrate 101. The same explanation as described above may also be equally applied to the second grain B and the third grain C.

Referring to FIG. 3A, the ferroelectric pattern 325 formed according to an embodiment may include a plurality of grains, for example, first to third grains D, E and F. Although FIG. 3A illustrates an example in which the ferroelectric pattern 325 includes three grains D, E and F, the present disclosure is not limited thereto. For example, in some embodiments, the ferroelectric pattern 325 may include four or more grains.

The first to third grains D, E and F may each have first through third polarization axes, with polarization axis planar directions Pd, Pe and Pf in the x-z plane, which are arrayed to have the same direction. For example, all of the first, second and third polarization axis planar directions Pd, Pe and Pf may have the same direction as the Z-axis which is perpendicular to a surface of the substrate 101.

Meanwhile, if a first write voltage having a positive polarity is applied to the gate electrode pattern 135 of the ferroelectric memory device 1 including the ferroelectric pattern 325, then the polarization in the ferroelectric pattern 325 may change to align to an electric field created by the first write voltage. In such a case, as illustrated in FIG. 3A, the first to third polarization axis planar directions Pd, Pe and Pf have the same direction, which is substantially perpendicular to a surface of the substrate 101. Thus, all of unit polarization vectors in the first to third grains D, E and F may also be perpendicular to a surface of the substrate 101. For example, if the first write voltage is applied to the gate electrode pattern 135 of the ferroelectric memory device 1 including the ferroelectric pattern 325, then a unit polarization vector Dp1 in the first grain D may be arrayed to be substantially perpendicular to a surface of the substrate 101. Similarly, unit polarization vectors in grains E and F are also substantially perpendicular to a surface of the substrate 101 in the x-z plane. A total polarization of the ferroelectric pattern 325 may be expressed as a sum of the unit polarization vectors of the grains D, E and F. Thus, if the first write voltage is applied to the gate electrode pattern 135 of the ferroelectric memory device 1 including the ferroelectric pattern 325, then the total polarization in the ferroelectric pattern 325 may effectively induce electrons into the channel region 105 of the substrate 101 in the plane.

Similarly, as illustrated in FIG. 3C, if a second write voltage having a negative polarity is applied to the gate electrode pattern 135 of the ferroelectric memory device 1 including the ferroelectric pattern 325, then the polarization in the ferroelectric pattern 325 may be arrayed according to an electric field which is created by the second write voltage. For example, if the second write voltage is applied to the gate electrode pattern 135 of the ferroelectric memory device 1 including the ferroelectric pattern 325, then a unit polarization vector Dp2 in the first grain D may be directed substantially perpendicular to a surface of the substrate 101. Thus, if the second write voltage is applied to the gate electrode pattern 135, then the polarization in the ferroelectric pattern 325 may effectively repel electrons from the channel region 105 of the substrate 101. The electrons may move into other regions of the substrate 101.

As described above, directions of the unit polarization vectors arrayed in the ferroelectric pattern 225 or 325 by an external voltage applied to the gate electrode pattern 135 may be determined by the polarization axis planar directions Pa, Pb and Pc in the grains A, B and C, or the polarization axis planar directions Pd, Pe and Pf in the grains D, E and F. Thus, hereinafter, the present disclosure provides methods of fabricating a ferroelectric memory device, which are capable of controlling directions of the polarization axes in the ferroelectric pattern 125.

Figure 4:
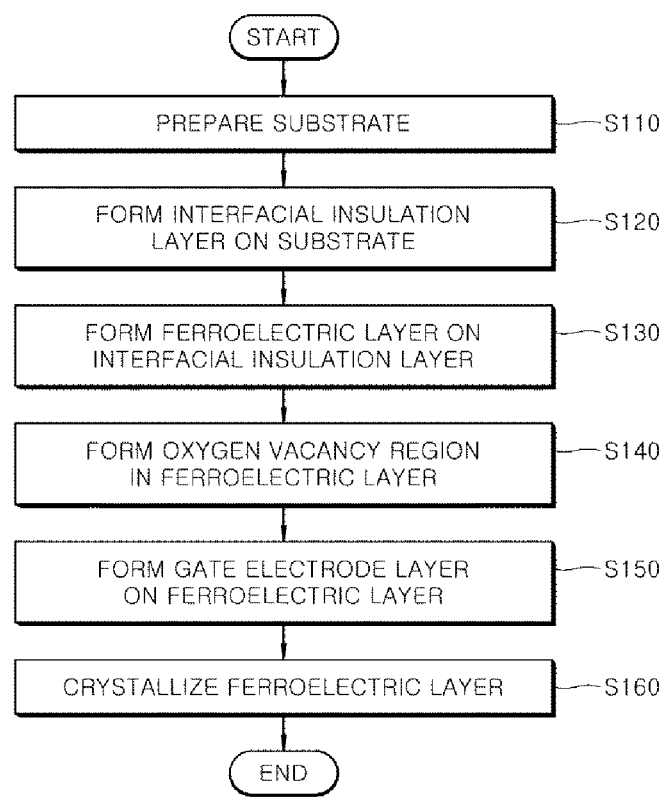
FIG. 4 is a flowchart illustrating a method of fabricating a ferroelectric memory device according to an embodiment of the present disclosure.

FIG. 4 is a flowchart illustrating a method of fabricating a ferroelectric memory device according to an embodiment of the present disclosure. In an embodiment, the fabricating method illustrated in FIG. 4 provides the ferroelectric memory device including the ferroelectric pattern 325 illustrated in FIGS. 3A, 3B and 3C. Referring to FIG. 4, a substrate may be provided (step S110). The substrate may include a semiconductor material. For example, the substrate may be a silicon (Si) substrate, a gallium arsenide (GaAs) substrate, an indium phosphide (InP) substrate, a germanium (Ge) substrate or a silicon germanium (SiGe) substrate. The substrate may be doped with impurities to have a conductivity type, e.g., n-type or p-type.

An interfacial insulation layer may be formed or disposed on the substrate (step S120). The interfacial insulation layer may be formed or disposed to include a silicon oxide (SiO) material, a silicon nitride (SiN) material, a silicon oxynitride (SiON) material or an aluminum oxide (AlO) material. The interfacial insulation layer may be formed or disposed using a chemical vapor deposition (CVD) technique, an atomic layer deposition (ALD) technique or the like.

A ferroelectric layer may be formed or disposed on the interfacial insulation layer (step S130). The ferroelectric layer may be formed or disposed to have an amorphous state. In an embodiment, the ferroelectric layer may be formed or disposed to include a binary metal oxide material. For example, the ferroelectric layer may be formed or disposed to include a hafnium oxide (HfO) material, a zirconium oxide (ZrO) material or a combination thereof. The ferroelectric layer may be formed or disposed using a CVD technique, an ALD technique or the like.

In an embodiment, the ferroelectric layer may be formed or disposed to include at least one dopant. The dopant may be uniformly distributed in the ferroelectric layer. For example, if the ferroelectric layer is formed or disposed to include a hafnium oxide (HfO) material, a zirconium oxide (ZrO) material or a combination thereof, then the ferroelectric layer may be doped with a dopant having a valence of two to four. The dopant distributed in the ferroelectric layer may stabilize a ferroelectric property of the ferroelectric layer after the ferroelectric layer is crystallized.

A surface treatment process may be applied to the ferroelectric layer to form an oxygen vacancy region in the ferroelectric layer (step S140). The oxygen vacancy region may be formed or disposed to have a preset depth or a predetermined thickness, as measured from a top surface of the ferroelectric layer toward the bulk of the ferroelectric layer.

In an embodiment, the surface treatment applied to the ferroelectric layer may include a plasma process. The plasma process may be performed using an inert gas, such as argon (Ar) gas, a neon (Ne) gas or the like. The surface treatment process may increase a concentration of oxygen vacancies in the ferroelectric layer to form an oxygen vacancy region.

In an embodiment, the surface treatment process may include a dopant injection process in which impurities are injected into an upper region of the ferroelectric layer. If the ferroelectric layer includes a metal oxide material, then the dopant injected into the ferroelectric layer may include metal ions having a valence which is different from a valence of the metal included in the metal oxide material. The dopant may be injected into the ferroelectric layer using an ion implantation technique. If the dopant is injected into the ferroelectric layer, then the concentration of the oxygen vacancies in the ferroelectric layer increases.

A gate electrode layer may then be formed or disposed on the ferroelectric layer (step S150). The gate electrode layer may be formed to include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials thereof. The gate electrode layer may be formed or disposed using a CVD technique, an ALD technique, a sputtering technique or the like.

The ferroelectric layer may be annealed using a thermal treatment process to crystallize the ferroelectric layer (step S160). As a result, the ferroelectric layer may have a crystalline structure. In an embodiment, the ferroelectric layer may be crystallized by annealing the ferroelectric memory device including the substrate and the interfacial insulation layer, the ferroelectric layer including the oxygen vacancy region, and the gate electrode layer, which are sequentially stacked on the substrate. Annealing takes place at a temperature of approximately 500 degrees Celsius to approximately 1000 degrees Celsius. The ferroelectric layer exposed to the thermal treatment process may have a ferroelectric property after annealing.

Since the oxygen vacancies in the oxygen vacancy region, at or near the surface of the ferroelectric layer common to the gate electrode layer, have positive charges, the position of the charges tends to generate an electric field across the ferroelectric layer. The electric field is in place across the ferroelectric layer during the thermal treatment process performed to crystallize the ferroelectric layer. Thus, grains in the crystallized ferroelectric layer may be formed to have polarization axes arrayed consistent with the electric field across the ferroelectric layer developed in part by the location of the oxygen vacancies. That is, directions of the polarization axes of the grains in the crystallized ferroelectric layer may be determined by the concentration and the distribution profile of the oxygen vacancies in the oxygen vacancy region. In an embodiment, the directions of the polarization axes of the grains in the crystallized ferroelectric layer may be perpendicular to a surface of the substrate along with the direction of the electric field.

Although not shown in FIG. 4, the gate electrode layer, the ferroelectric layer and the interfacial insulation layer may be patterned to form an interfacial insulation pattern, a ferroelectric pattern and a gate electrode pattern which are sequentially stacked on a portion of the substrate. Subsequently, impurity ions may be implanted into the substrate using the gate electrode pattern as an ion implantation mask, thereby forming a source region and a drain region which are spaced apart from each other.

A ferroelectric memory device according to an embodiment may be fabricated by performing the process steps described above.

Directions of the polarization axes of the grains in the crystallized ferroelectric pattern may depend on the concentration and the distribution profile of the oxygen vacancies in the oxygen vacancy region. In such a case, the crystallized ferroelectric pattern may exhibit two different remanent polarizations having two opposite directions that are parallel with the polarization axes. The crystallized ferroelectric pattern may have any one of two different remanent polarizations after a write operation of the ferroelectric memory device is performed. Since, the polarization axis is perpendicular to a surface of the substrate, both of the two different remanent polarizations in the crystallized ferroelectric pattern may be arrayed to be parallel with a direction which is perpendicular to a surface of the substrate. Thus, an attractive force for inducing electrons into the channel region of the substrate and a repulsive force for repelling the electrons from the channel region may be maximized to improve the reliability of a switching characteristic of the ferroelectric memory device.

In some other embodiments, after the step S140 for forming the oxygen vacancy region is performed, it is followed by the step S160 for crystallizing the ferroelectric layer, after which step S150 for forming the gate electrode layer is completed. That is, the ferroelectric layer including the oxygen vacancy region may be annealed to crystallize the ferroelectric layer, before the gate electrode layer is applied, so that the gate electrode layer is formed on a crystallized ferroelectric layer.

In some other embodiments, the crystallized ferroelectric layer may be further annealed using a hydrogen gas as an ambient gas after the step S160 of FIG. 4 for crystallizing the ferroelectric layer is completed. For one example, the additional annealing process (i.e., a hydrogen annealing process) may be performed after the steps S130, S140, S150 and S160 are sequentially performed. For another example, the additional annealing process may be performed after steps S130, S140, and S160 are sequentially performed. After the additional annealing process is performed, the step S150 may be performed. For still another example, the additional annealing process may be performed after steps S130, S140, S160, and S150 are sequentially performed. The additional annealing process using the hydrogen gas as the ambient gas, may be executed to remove the oxygen vacancies in the crystallized ferroelectric layer. The hydrogen annealing process may be performed at a temperature of approximately 300 degrees Celsius to approximately 500 degrees Celsius.

The hydrogen annealing process may be performed to remove the oxygen vacancies because the oxygen vacancy region may promote leakage current. Without an annealing process, when an external voltage is applied to the gate electrode during a write operation or a read operation of the ferroelectric memory device after the ferroelectric memory device is made, the oxygen vacancies may move toward the gate electrode or the substrate, depending on the voltage bias, to cause a leakage current in the ferroelectric memory device. Thus, the hydrogen annealing process may be performed to remove the oxygen vacancies that cause the leakage current in the ferroelectric memory device.

In some other embodiments, fluorine ions may be additionally implanted into the crystallized ferroelectric layer by injection after the step S160 for crystallizing the ferroelectric layer is performed. The fluorine ions implanted into the crystallized ferroelectric layer may be trapped in the oxygen vacancies which negate or limit the effects of oxygen vacancies in the cell.

In some other embodiments, the hydrogen annealing process and the fluorine injection process may be sequentially performed after the ferroelectric layer is crystallized. In other embodiments, either the hydrogen annealing process or the fluorine injection process is completed after the ferroelectric layer is crystallized.

Figure 5:
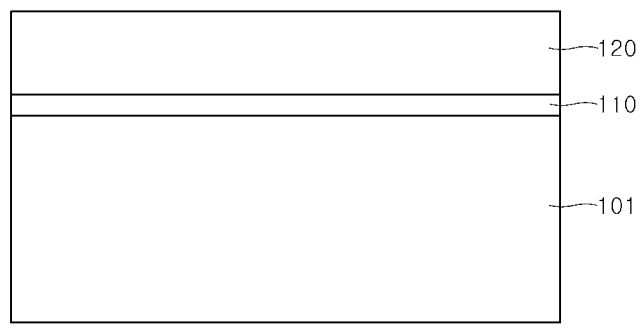
FIGS. 5 to 9 are cross-sectional views schematically illustrating a method of fabricating a ferroelectric memory device according to an embodiment of the present disclosure.

FIGS. 5 to 9 are cross-sectional views illustrating a method of fabricating a ferroelectric memory device included in a ferroelectric memory device according to an embodiment of the present disclosure. Referring to FIG. 5, a substrate 101 may be provided. The substrate 101 may include a semiconductor material. For example, the substrate 101 may be a silicon (Si) substrate, a gallium arsenide (GaAs) substrate, an indium phosphide (InP) substrate, a germanium (Ge) substrate or a silicon germanium (SiGe) substrate. The substrate 101 may be doped with impurities to have a conductivity type.

An interfacial insulation layer 110 may be formed or disposed to have an amorphous state. The interfacial insulation layer 110 may be formed or disposed to include a silicon oxide (SiO) material, a silicon nitride (SiN) material, a silicon oxynitride (SiON) material or an aluminum oxide (AlO) material. In an embodiment, if the substrate 101 is a silicon substrate, then the interfacial insulation layer 110 may be formed of a silicon oxide (SiO) material, a silicon nitride (SiN) material or a silicon oxynitride (SiON) material. The interfacial insulation layer 110 may be formed or disposed using a chemical vapor deposition (CVD) technique, an atomic layer deposition (ALD) technique or the like.

Subsequently, a ferroelectric layer 120 may be formed or disposed on the interfacial insulation layer 110. The ferroelectric layer 120 may be formed or disposed to have an amorphous state. In an embodiment, the ferroelectric layer 120 may be formed to include a metal oxide material. For example, the ferroelectric layer 120 may be formed to include a hafnium oxide (HfO) material, a zirconium oxide (ZrO) material or a combination thereof. The ferroelectric layer 120 may be formed or disposed using a CVD technique, an ALD technique or the like.

In an embodiment, the ferroelectric layer 120 may include at least one dopant. The dopant may be uniformly distributed in the ferroelectric layer 120. If the ferroelectric layer 120 includes a hafnium oxide (HfO) material, a zirconium oxide (ZrO) material or a combination thereof, then the ferroelectric layer 120 may be doped with a dopant having a valence of two to four. For example, the dopant of the ferroelectric layer 120 may include at least one of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd) and lanthanum (La).

Figure 6:
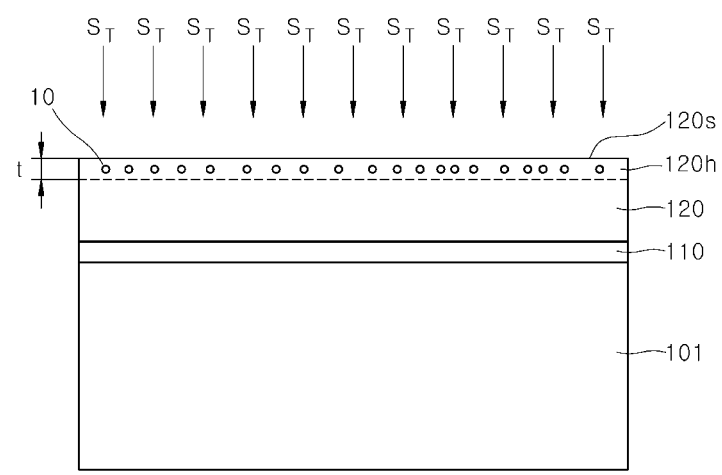

Referring to FIG. 6, a surface treatment process ST may be applied to the ferroelectric layer 120 to form an oxygen vacancy region 120h in the ferroelectric layer 120. The oxygen vacancy region 120h may have a depth t (i.e., a thickness t) extending from a top surface 120s of the ferroelectric layer 120 down into the bulk of the ferroelectric layer 120. A maximum depth (i.e., a maximum thickness) of the oxygen vacancy region 120h may be about half the thickness of the ferroelectric layer 120. In an embodiment, the ferroelectric layer 120 may be formed or disposed to have a thickness of approximately seven (7) nm to approximately fifteen (15) nm, and the oxygen vacancy region 120h may be formed or disposed to have a depth of approximately two (2) nm to approximately five (5) nm. In another embodiment, the ferroelectric layer 120 may be formed or disposed to have a thickness of approximately five (5) nm, and the oxygen vacancy region 120h may be formed to have a depth of approximately one (1) nm to approximately two (2) nm.

In an embodiment, the surface treatment process ST may include a plasma process which is applied to the ferroelectric layer 120. The plasma process may be performed using an inert gas, for example argon (Ar) gas, a neon (Ne) gas or the like. If the ferroelectric layer 120 is formed to include a metal oxide material, then the plasma process may break metal-oxygen bonds in the metal oxide material to generate oxygen vacancies 10 in the metal oxide material. That is, the plasma process may increase a concentration of the oxygen vacancies 10 in the metal oxide material used in the ferroelectric layer 120.

In another embodiment, the surface treatment process ST may include a dopant injection process for injecting dopants into an upper region of the ferroelectric layer 120. If the ferroelectric layer 120 is formed to include a metal oxide material, then the dopant injected into the ferroelectric layer 120 may include metal ions having a valence which is different from a valence of the metal included in the metal oxide material. The dopant may be injected into the ferroelectric layer 120 using an ion implantation technique. The dopant may incompletely bond with the oxygen of the metal oxide contained in the ferroelectric layer 120 to form the oxygen vacancies 10 in the metal oxide. Like the plasma process, the dopant injection process may also increase a concentration of the oxygen vacancies 10 in the metal oxide material utilized in the ferroelectric layer 120.

Figure 7:
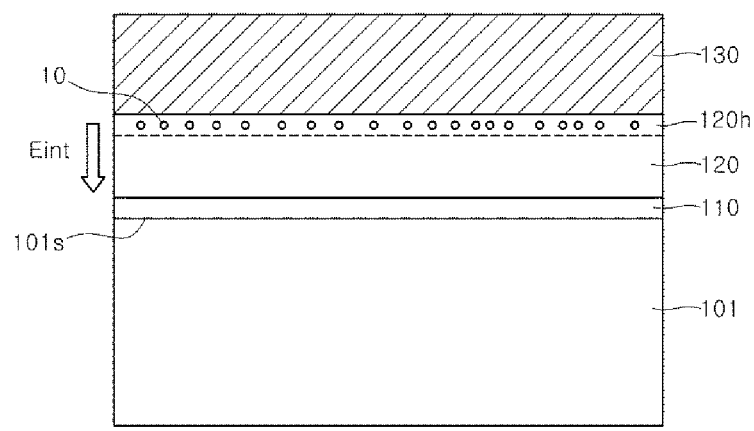

Referring to FIG. 7, a gate electrode layer 130 may be formed or disposed on the ferroelectric layer 120 including the oxygen vacancy region 120h. The gate electrode layer 130 may be formed to include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials listed above. The gate electrode layer 130 may be formed or disposed using a CVD technique, an ALD technique, a sputtering technique or the like.

Figure 8:
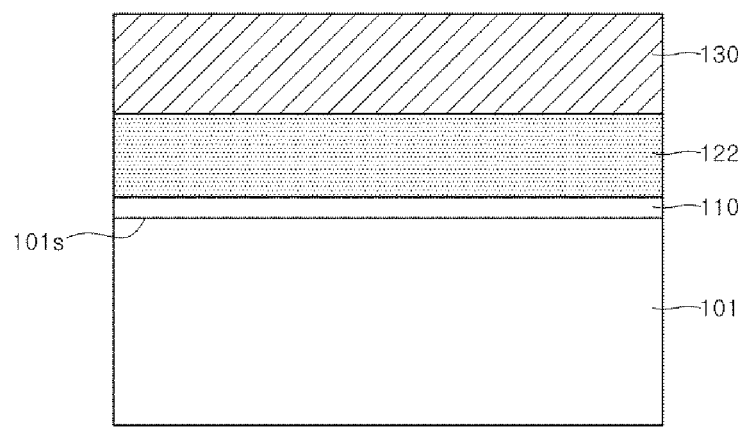

Subsequently, the ferroelectric layer 120 including the oxygen vacancy region 120h, which is covered by the gate electrode layer 130, may be annealed to crystallize the ferroelectric layer 120. As a result, a crystalline ferroelectric layer 122 (also, referred to as a crystallized ferroelectric layer 122) may be formed, as illustrated in FIG. 8. In an embodiment, the crystalline ferroelectric layer 122 may be formed by annealing the ferroelectric memory device, including substrate 101, the interfacial insulation layer 110, the ferroelectric layer 120 including the oxygen vacancy region 120h and the gate electrode layer 130, sequentially stacked on the substrate 101. Annealing takes place at a temperature of approximately 500 degrees Celsius to approximately 1000 degrees Celsius. The annealing process for forming the crystalline ferroelectric layer 122 may be performed after the gate electrode layer 130, which acts as a capping layer, is formed over ferroelectric layer 120.

Referring again to FIG. 7, since the oxygen vacancies 10 in the oxygen vacancy region 120h act as positive charges, an electric field Eint may be created across the ferroelectric layer 120. The ferroelectric memory device, with the electric field Eint across ferroelectric layer 120, may be annealed to form the crystalline ferroelectric layer 122 illustrated in FIG. 8. Thus, grains in the crystallized ferroelectric layer 122 may be formed to have polarization axes aligned along the electric field Eint. Thus, orientations of the polarization axes of the grains in the crystallized ferroelectric layer 122 may be controlled by the concentration and the distribution profile of the oxygen vacancies 10 in the oxygen vacancy region 120h.

In an embodiment, if the electric field Eint is oriented from the gate electrode layer 130 toward the substrate 101, then the grains in the crystallized ferroelectric layer 122 that undergo the annealing process to have polarization axes which parallel with a direction perpendicular to a surface 101s of the substrate 101. The oxygen vacancy region 120h may have a thickness of approximately two (2) nm to approximately five (5) nm.

Figure 9:
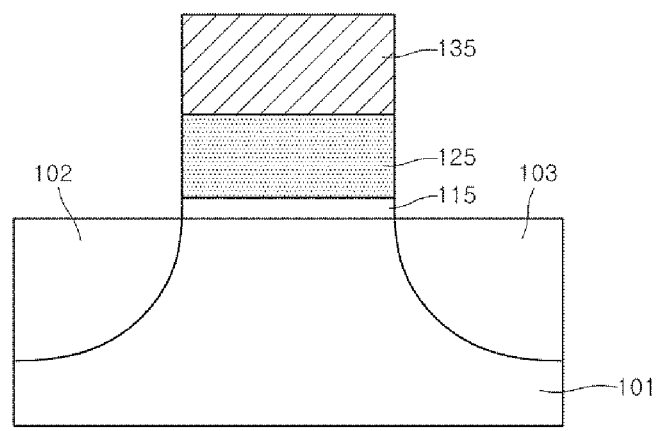

Referring to FIG. 9, the gate electrode layer 130, the crystallized ferroelectric layer 122 and the interfacial insulation layer 110 may be patterned to form an interfacial insulation pattern 115, a ferroelectric pattern 125 and a gate electrode pattern 135 which are sequentially stacked on the substrate 101. Subsequently, impurity ions may be implanted into the substrate 101 using the gate electrode pattern 135 as an ion implantation mask, thereby forming a source region 102 and a drain region 103 which are spaced apart from each other. The source region 102 and the drain region 103 may be formed to have a conductivity type which is opposite to a conductivity type of the substrate 101. For example, if the substrate 101 is doped with P-type impurity ions, then the source region 102 and the drain region 103 may be doped with N-type impurity ions.

In some other embodiments, the annealing process for crystallizing the ferroelectric layer 120 described above and with reference to FIGS. 7 and 8 may be performed before the gate electrode layer 130 is formed on the ferroelectric layer 120. That is, the annealing process for crystallizing the ferroelectric layer 120 may be performed after the oxygen vacancy region 120h is formed in the ferroelectric layer 120, with the gate electrode layer 130 formed afterward on the crystallized ferroelectric layer 122. Next, the interfacial insulation pattern 115, the ferroelectric pattern 125, the gate electrode pattern 135, the source region 102 and the drain region 103 may be formed using the same techniques as described above and with reference to FIG. 9.

A ferroelectric memory device according to an embodiment may be fabricated using the various processes, as described above and with reference to FIGS. 4 to 9. According to the fabrication method, a surface treatment process may be applied to a ferroelectric layer to form an oxygen vacancy region in the ferroelectric layer. Subsequently, the ferroelectric layer, including the oxygen vacancy region, may be annealed to form a crystallized ferroelectric layer.

Oxygen vacancies in the oxygen vacancy region establish an electric field across the ferroelectric layer. During the annealing process, that electric field influences the arrangement of polarization axes of grains formed in the crystallized ferroelectric layer. Subsequently, when the ferroelectric memory device operates in a write mode or a read mode, the unit polarization orientations formed in the crystallized ferroelectric layer are parallel with the polarization axes of the grains. Accordingly, the reliability of a switching operation of the ferroelectric memory device may be improved.

Figure 10:
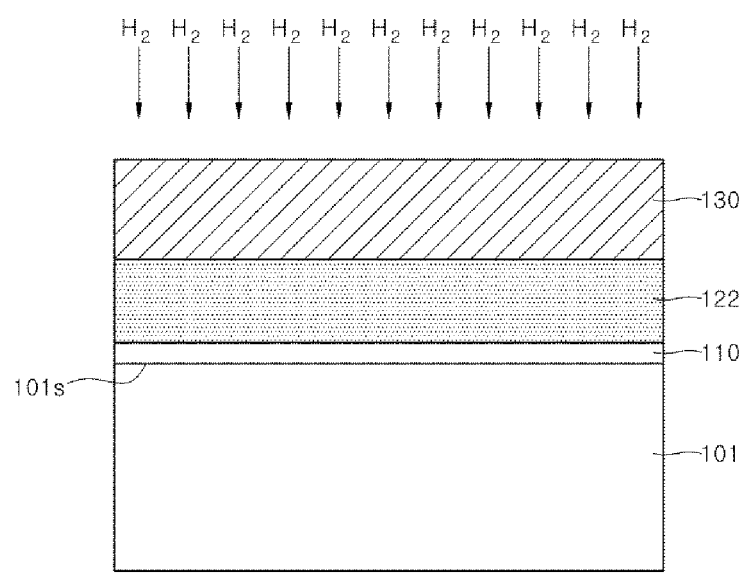
FIG. 10 is a cross-sectional view schematically illustrating a method of fabricating a ferroelectric memory device according to another embodiment of the present disclosure.

FIG. 10 is a cross-sectional view illustrating a method of fabricating a ferroelectric memory device according to another embodiment of the present disclosure. Referring to FIG. 10, the method according to the present embodiment may further include an additional annealing process performed using a hydrogen gas as an ambient gas, after the ferroelectric layer 120 is annealed, to form the crystallized ferroelectric layer 122 illustrated in FIG. 8, as compared with the embodiment illustrated in FIGS. 4 to 9.

While the hydrogen annealing process is performed, hydrogen H2 may be injected into the crystallized ferroelectric layer 122 through the gate electrode layer 130. The hydrogen H2 injected into the crystallized ferroelectric layer 122 may react with the oxygen vacancies 10 to remove the oxygen vacancies 10. The hydrogen annealing process may be executed at a temperature of approximately 300 degrees Celsius to approximately 500 degrees Celsius.

The hydrogen annealing process may be performed to remove the oxygen vacancies because the oxygen vacancy region may promote leakage current. Without an annealing process, when an external voltage is applied to the gate electrode pattern 135 during a write operation or a read operation of the ferroelectric memory device, during a write operation or a read operation of the ferroelectric memory device, the oxygen vacancies 10 may move toward the gate electrode pattern 135 or the substrate 101, depending on the voltage bias, to cause a leakage current in the ferroelectric memory device.

Thus, the hydrogen annealing process may be performed to remove the oxygen vacancies 10 that cause the leakage current in the ferroelectric memory device.

Subsequently, the interfacial insulation pattern 115, the ferroelectric pattern 125, the gate electrode pattern 135, the source region 102 and the drain region 103 may be formed using the same techniques as described above and with reference to FIG. 9.

In some other embodiments, the hydrogen annealing process may be performed after the source region 102 and the drain region 103 are formed as shown in FIG. 9. In yet another embodiment, the hydrogen annealing process may be performed after the gate electrode pattern 135, the ferroelectric pattern 125 and the interfacial insulation pattern 115 are formed, but before the source region 102 and the drain region 103 are formed.

Figure 11:
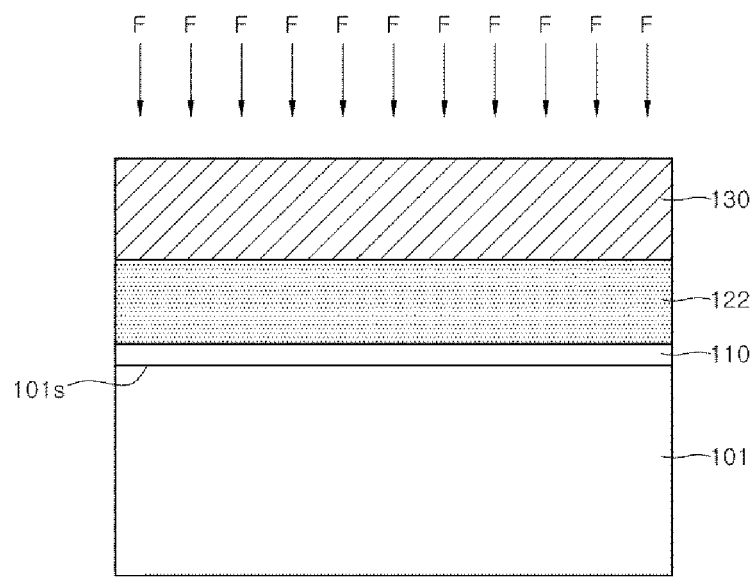
FIG. 11 is a cross-sectional view schematically illustrating a method of fabricating a ferroelectric memory device according to yet another embodiment of the present disclosure.

FIG. 11 is a cross-sectional view illustrating a method of fabricating a ferroelectric memory device according to yet another embodiment of the present disclosure. Referring to FIG. 11, the method according to the present embodiment may further include a process for injecting fluorine ions F into the crystallized ferroelectric layer 122 after the ferroelectric layer 120 is annealed to form the crystallized ferroelectric layer 122 illustrated in FIG. 8, as compared with the embodiment illustrated in FIGS. 4 to 9. The fluorine ions F may be injected into the crystallized ferroelectric layer 122 using an ion implantation technique. The fluorine ions F implanted into the crystallized ferroelectric layer 122 may react with the oxygen vacancies 10 and effectively remove them.

Subsequently, the interfacial insulation pattern 115, the ferroelectric pattern 125, the gate electrode pattern 135, the source region 102 and the drain region 103 may be formed using the same techniques as described above and with reference to FIG. 9.

In some other embodiments, the fluorine injection process may be performed after the source region 102 and the drain region 103 are formed. In yet other embodiments, the fluorine injection process may be performed after the gate electrode pattern 135, the ferroelectric pattern 125 and the interfacial insulation pattern 115 are formed, but before the source region 102 and the drain region 103 are formed.

In some other embodiments, the hydrogen annealing process illustrated in FIG. 10 and the fluorine injection process illustrated in FIG. 11 may be performed, in any sequence or order, after the ferroelectric layer 120 is crystallized.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of fabricating a ferroelectric memory device, the method comprising:
   preparing a substrate;
   forming an interfacial insulation layer on the substrate;
   forming a ferroelectric layer directly on the interfacial insulation layer;
   applying a surface treatment process to the ferroelectric layer to form an oxygen vacancy region in the ferroelectric layer;
   creating an electric field across the ferroelectric layer;
   forming a gate electrode layer on the ferroelectric layer; and
   annealing the ferroelectric layer to crystallize the ferroelectric layer,
   wherein the oxygen vacancy region extends from a top surface of the ferroelectric layer into the bulk of the ferroelectric layer,
   wherein the thickness of the oxygen vacancy region is one-half the thickness of the ferroelectric layer, and
   wherein the oxygen vacancy region has a plurality of oxygen vacancies that act as positive charges.

2. The method of claim 1, wherein the ferroelectric layer is formed to include a binary metal oxide material.

3. The method of claim 2, wherein the ferroelectric layer is formed to include at least one of a hafnium oxide (HfO) material and a zirconium oxide (ZrO) material.

4. The method of claim 1, wherein the surface treatment process includes a plasma process applied to the ferroelectric layer.

5. The method of claim 4, wherein the plasma process is performed using an inert gas.

6. The method of claim 1, wherein the surface treatment process includes injecting a dopant into an upper region of the ferroelectric layer.

7. The method of claim 6,
   wherein the ferroelectric layer includes a binary metal oxide material and the dopant includes metal ions having a valence which is different from a valence of metal atoms in the binary metal oxide material.

8. The method of claim 7, wherein the ferroelectric layer is formed to include a hafnium oxide (HfO) material or a zirconium oxide (ZrO) material, and the dopant includes at least one of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd) and lanthanum (La).

9. The method of claim 1,
   wherein the ferroelectric layer has a thickness of approximately seven (7) nanometers (nm) to approximately fifteen (15) nm; and
   wherein the oxygen vacancy region is formed to have a depth of approximately two (2) nm to approximately five (5) nm from a top surface of the ferroelectric layer.

10. The method of claim 1, wherein annealing the ferroelectric layer is performed after the gate electrode layer is formed on the ferroelectric layer and the gate electrode layer acts as a capping layer of the ferroelectric layer.

11. The method of claim 1, wherein annealing the ferroelectric layer is performed at a temperature of approximately 500 degrees Celsius to approximately 1000 degrees Celsius.

12. The method of claim 1, further comprising applying a second annealing process to the crystallized ferroelectric layer after the ferroelectric layer is crystallized,
   wherein the second annealing process is performed using a hydrogen gas as an ambient gas.

13. The method of claim 1, further comprising injecting fluorine ions into the crystallized ferroelectric layer after the ferroelectric layer is crystallized.

14. A method of fabricating a ferroelectric memory device, the method comprising:
   preparing a substrate;
   forming an interfacial insulation layer on the substrate;
   forming a ferroelectric layer including a metal oxide material directly on the interfacial insulation layer;
   applying a surface treatment process to the ferroelectric layer to increase a concentration of oxygen vacancies in the metal oxide material;
   creating an electric field across the ferroelectric layer;
   forming a gate electrode layer on the ferroelectric layer; and
   annealing the ferroelectric layer to crystallize the ferroelectric layer using the gate electrode layer as a capping layer,
   wherein the concentration of oxygen vacancies is located in a portion of the ferroelectric layer from a top surface of the ferroelectric layer into the bulk of the ferroelectric layer,
   wherein the thickness of the portion of the ferroelectric layer with the concentration of oxygen vacancies is one-half the thickness of the ferroelectric layer, and
   wherein the concentration of oxygen vacancies act as positive charges.

15. The method of claim 14, wherein the metal oxide material includes at least one of a hafnium oxide (HfO) material and a zirconium oxide (ZrO) material.

16. The method of claim 14, wherein the surface treatment process includes a plasma process that is performed using an inert gas.

17. The method of claim 14, wherein the surface treatment process includes injecting a dopant into an upper region of the ferroelectric layer.

18. The method of claim 17,
   wherein the ferroelectric layer includes a binary metal oxide material, and the dopant includes metal ions having a valence which is different from a valence of metal atoms in the binary metal oxide material.

19. The method of claim 14,
   wherein a surface treated region is formed in the ferroelectric layer by the surface treatment process with a predetermined depth from a top surface of the ferroelectric layer; and
   wherein a maximum value of the predetermined depth is about half the thickness of the ferroelectric layer.

20. The method of claim 14, wherein annealing is performed at a temperature of approximately 500 degrees Celsius to approximately 1000 degrees Celsius.

* * * * *